United States Patent
Dadvand et al.

(10) Patent No.: US 11,127,515 B2
(45) Date of Patent: Sep. 21, 2021

(54) NANOSTRUCTURE BARRIER FOR COPPER WIRE BONDING

(71) Applicant: Texas Instruments Incorporated, Dallas, TX (US)

(72) Inventors: Nazila Dadvand, Richardson, TX (US); Christopher Daniel Manack, Flower Mound, TX (US); Salvatore Frank Pavone, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/854,839

(22) Filed: Apr. 21, 2020

(65) Prior Publication Data

US 2020/0251257 A1  Aug. 6, 2020

Related U.S. Application Data

(62) Division of application No. 15/984,346, filed on May 19, 2018, now Pat. No. 10,629,334.

(60) Provisional application No. 62/561,050, filed on Sep. 20, 2017.

(51) Int. Cl.
    *H01L 23/00* (2006.01)
    *H01B 13/00* (2006.01)
    *H01B 1/02* (2006.01)

(52) U.S. Cl.
    CPC ......... *H01B 13/0036* (2013.01); *H01B 1/026* (2013.01); *H01L 24/03* (2013.01); *H01L 24/05* (2013.01); *H01L 24/43* (2013.01); *H01L 24/45* (2013.01); *H01L 24/85* (2013.01); *H01L 2224/04042* (2013.01); *H01L 2224/291* (2013.01); *H01L 2224/2919* (2013.01); *H01L 2224/32245* (2013.01); *H01L 2224/43* (2013.01); *H01L 2224/45147* (2013.01); *H01L 2224/45184* (2013.01);
    (Continued)

(58) Field of Classification Search
    CPC ......... H01L 24/03; H01L 24/05; H01L 24/11; H01L 24/13; H01L 24/14; H01L 24/16; H01L 24/45; H01L 24/43; H01L 24/46; H01L 24/48; H01L 24/49; H01L 24/78; H01L 24/81; H01L 24/85; H01L 23/3114; H01L 23/3157; H01L 23/3192; H01L 23/525
    See application file for complete search history.

(56) References Cited

U.S. PATENT DOCUMENTS

| | | | | |
|---|---|---|---|---|
| 2008/0284000 A1* | 11/2008 | Fee | ......................... | H01L 24/81 257/702 |
| 2012/0325517 A1* | 12/2012 | Uzoh | .................. | H01B 13/0036 174/126.2 |
| 2013/0328197 A1* | 12/2013 | Hosseini | ........... | H01L 23/53238 257/751 |

* cited by examiner

*Primary Examiner* — Farun Lu
(74) *Attorney, Agent, or Firm* — Dawn Jos; Charles A. Brill; Frank D. Cimino

(57) ABSTRACT

A nanostructure barrier for copper wire bonding includes metal grains and inter-grain metal between the metal grains. The nanostructure barrier includes a first metal selected from nickel or cobalt, and a second metal selected from tungsten or molybdenum. A concentration of the second metal is higher in the inter-grain metal than in the metal grains. The nanostructure barrier may be on a copper core wire to provide a coated bond wire. The nanostructure barrier may be on a bond pad to form a coated bond pad. A method of plating the nanostructure barrier using reverse pulse plating is disclosed. A wire bonding method using the coated bond wire is disclosed.

15 Claims, 9 Drawing Sheets

(52) U.S. Cl.
CPC ............... *H01L 2224/48247* (2013.01); *H01L 2224/73265* (2013.01); *H01L 2224/85205* (2013.01)

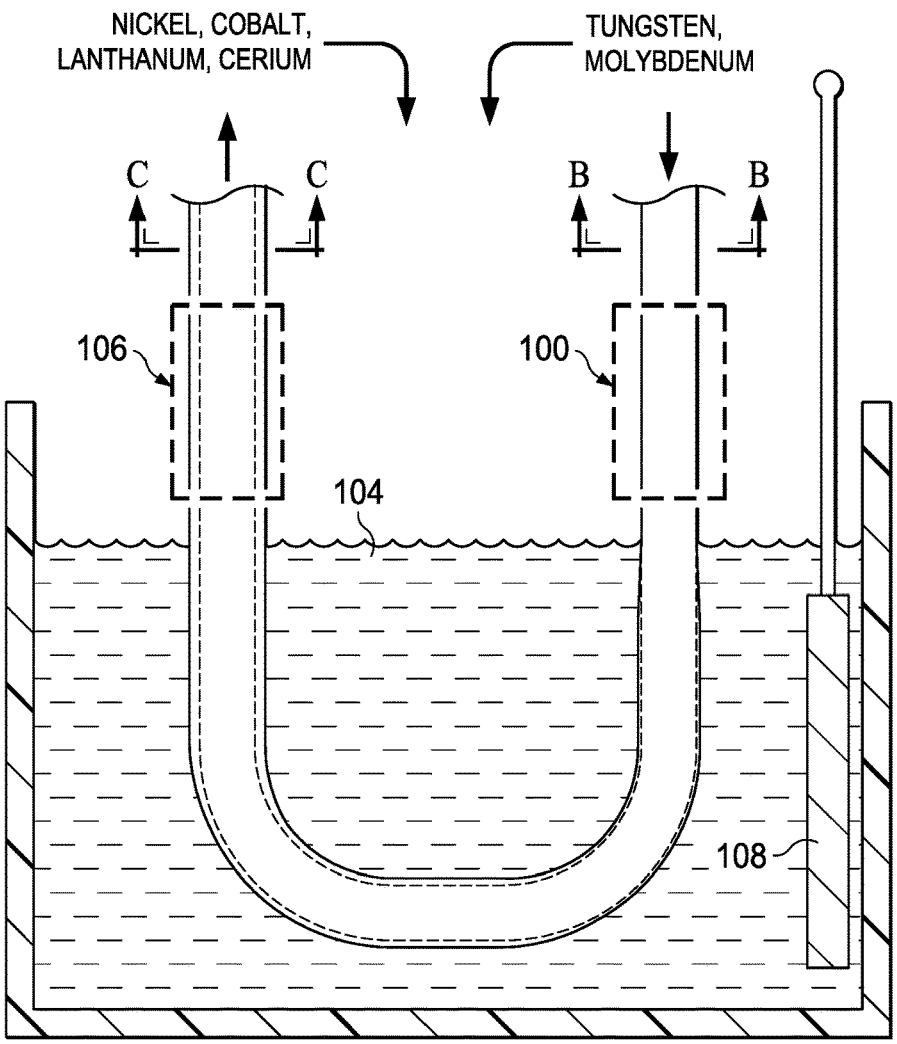
FIG. 1A
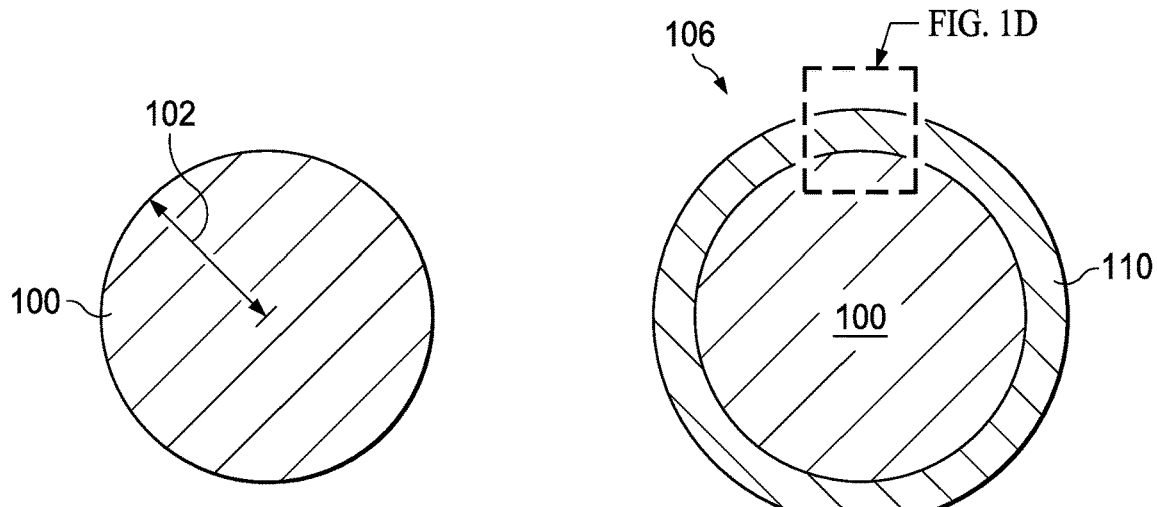
FIG. 1B
FIG. 1C

NANOSTRUCTURE BARRIER FOR COPPER WIRE BONDING

CROSS-REFERENCE TO RELATED APPLICATIONS

This application is a division of U.S. patent application Ser. No.15/984,346, filed May 19, 2018, which claims the benefit of priority under 35 U.S.C. § 119(e) of U.S. Provisional Application No. 62/561,050, filed Sep. 20, 2017, which is hereby incorporated by reference in its entirety.

FIELD OF THE DISCLOSURE

This disclosure relates to the field of wire bonding in electronic devices. More particularly, this disclosure relates to copper wire bonding in electronic devices.

BACKGROUND OF THE DISCLOSURE

Many electronic applications use copper bond wire instead of gold bond wire due to the lower cost of copper compared to gold. Although the thermal and electrical conductivity of copper is higher than gold, copper suffers from reliability issues due to its poor resistance against oxidation and corrosion. To reduce oxidation and corrosion, some copper wire is coated with palladium. Palladium is expensive, adding to fabrication costs of the electronic applications. Alternatively, bare copper wire is sometimes used, which requires special packaging during storage, and necessitates wire bonding in the presence of a reducing gas, adding to the fabrication costs.

SUMMARY OF THE DISCLOSURE

The present disclosure introduces a nanostructure barrier for copper wire bonding. The nanostructure barrier includes metal grains and an inter-grain metal between the metal grains. The nanostructure barrier include a first metal selected from nickel or cobalt. The nanostructure barrier includes a second metal selected from tungsten or molybdenum. A concentration of the second metal is higher in the nanostructure barrier than in the metal grains.

In one aspect, a coated bond wire with a nanostructure barrier on a surface of a copper core wire is disclosed. In another aspect, a method of plating the nanostructure barrier on the surface of the copper core wire is disclosed. In a further aspect, a wire bonding method using the coated bond wire is disclosed. In yet another aspect, a microelectronic device with the coated bond wire is disclosed. In a further aspect, a microelectronic device with a coated bond pad having the nanostructure barrier on a base bond pad is disclosed. In another aspect, a method of plating the nanostructure barrier on the base bond pad is disclosed.

BRIEF DESCRIPTION OF THE VIEWS OF THE DRAWINGS

FIG. 1A through FIG. 1D depict an example process of forming a coated bond wire.

DETAILED DESCRIPTION OF EXAMPLE EMBODIMENTS

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

Wire bonding with copper wire may be advantageously improved by a coated bond wire having a nanostructure barrier on a copper core wire or on a base bond pad, or both. The nanostructure barrier includes metal grains and an inter-grain metal between the metal grains. The term "nanostructure barrier" includes a layer having grains with dimensions from 1 to 100 nanometers, and which reduces diffusion of copper through the nanostructure barrier, and reduces diffusion of oxygen and water molecules through the barrier. The nanostructure barrier includes a first metal selected from nickel or cobalt. The nanostructure barrier further includes a second metal selected from tungsten or molybdenum. The metal grains include the first metal and the second metal, and the inter-grain metal includes the first metal and the second metal. A concentration of the second metal is higher in the inter-grain metal than in the metal grains. An average combined concentration of tungsten and molybdenum in the nanostructure barrier is 1 weight percent to 35 weight percent. Less than 1 weight percent is not effective at reducing diffusion of copper through the nanostructure barrier. More than 35 weight percent renders the nanostructure too hard for effective wire bonding, and increases an electrical resistance of a wire bond formed using the coated bond wire. The nanostructure barrier may include both nickel and cobalt. The nanostructure barrier may further include nickel and a third metal selected from cerium and lanthanum.

In one example, the coated bond wire may be formed by plating a nanostructure barrier on a copper core wire. In another example, a coated bond pad may be formed by plating a nanostructure barrier on a base bond pad. The base bond pad may include primarily aluminum. In a further example, a wire bonding process connects a copper bond wire to a bond pad on a microelectronic device; the copper bond wire may be a coated bond wire, or the bond pad may be a coated bond pad. For the purposes of this disclosure, the terms "copper core wire" and "copper bond wire" refer to core wires and bond wires that contain primarily copper, that is, include more than 90 weight percent copper, and may include other elements, such as gold.

Figure 1D:
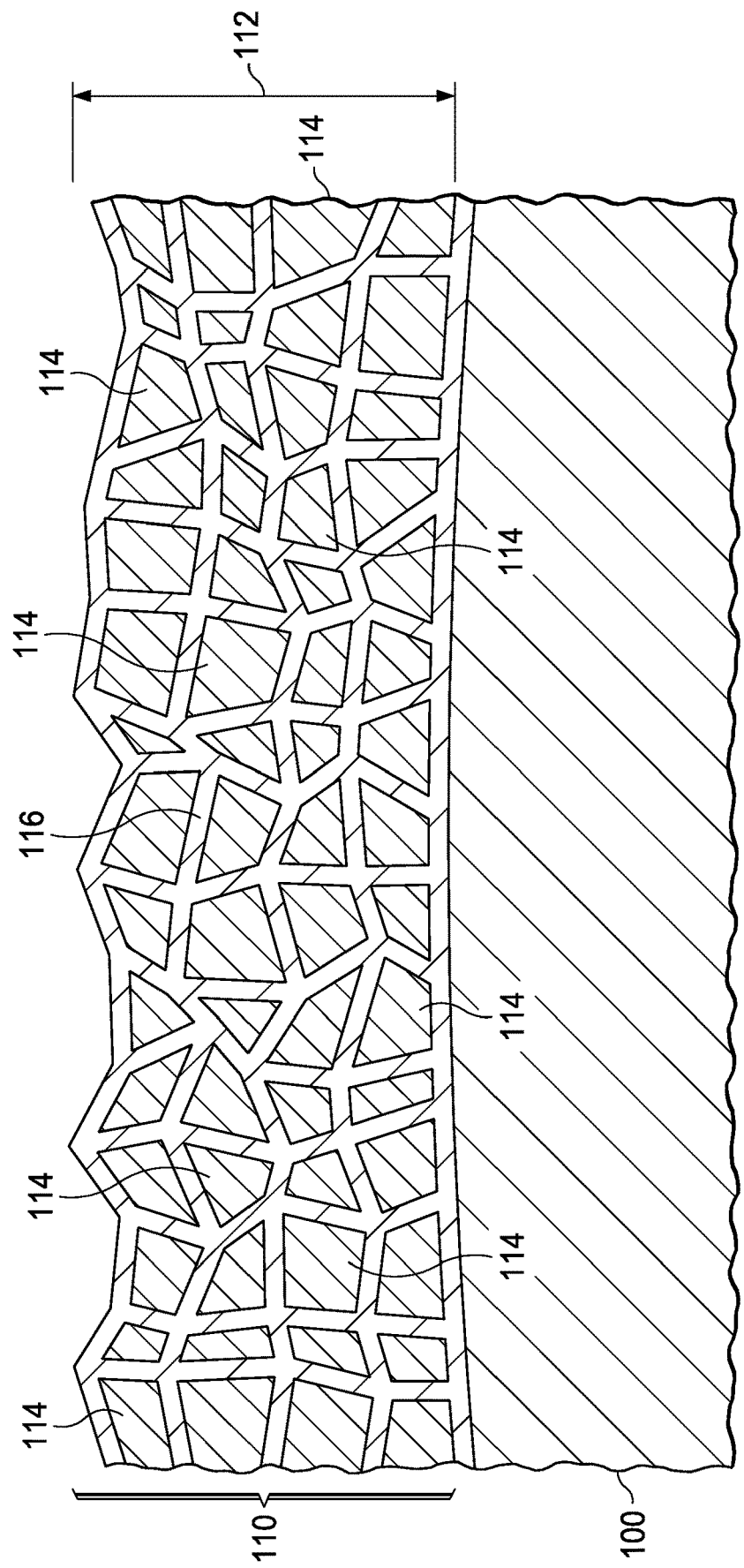

FIG. 1A through FIG. 1D depict an example process of forming a coated bond wire. Referring to FIG. 1A, a copper core wire 100 is processed in a plating operation in a barrier plating bath 104. FIG. 1B is a cross section of the copper core wire 100 before it is exposed to the barrier plating bath 104. The copper core wire 100 may have an average radius 102 of about 7 microns to about 26 microns, for example. The copper core wire 100 includes primarily copper. The copper core wire 100 may include only trace amounts of other elements, or may include a few weight percent of one or more elements such as gold, to provide desired mechanical properties.

Referring back to FIG. 1A, the copper core wire 100 may be fed through the barrier plating bath 104 in a continuous fashion, emerging from the barrier plating bath 104 as the coated bond wire 106, as indicated schematically in FIG. 1A. The barrier plating bath 104 includes a first metal selected from nickel or cobalt. The barrier plating bath 104 includes a second metal selected from tungsten or molybdenum. In one version of the instant example, the barrier plating bath 104 may include both nickel and cobalt. In another version, the barrier plating bath 104 may include nickel and a third metal selected from cerium or lanthanum. In a further version, the barrier plating bath 104 may include both tungsten and molybdenum. Nickel may be added to the barrier plating bath 104, as indicated in FIG. 1A, in the form of nickel sulfate. Cobalt may be added to the barrier plating bath 104 in the form of cobalt sulfate. Lanthanum may be added to the barrier plating bath 104 in the form of lanthanum oxide or lanthanum chloride. Cerium may be added to the barrier plating bath 104 in the form of cerium sulfate. Tungsten may be added to the barrier plating bath 104 in the form of sodium tungstate. Molybdenum may be added to the barrier plating bath 104 in the form of sodium molybdate. The barrier plating bath 104 may further include additives such as wetting agents, levelers, accelerators, or suppressors.

An anode 108 is disposed in the barrier plating bath 104. Current is flowed from the anode 108 through the barrier plating bath 104 to the copper core wire 100 to form a nanostructure barrier 110 on the copper core wire 100; FIG. 1C is a cross section of the coated bond wire 106, after it emerges from the barrier plating bath 104. The copper core wire 100 with the nanostructure barrier 110 provides the coated bond wire 106.

FIG. 1D is a cross section of a portion of the coated bond wire 106, depicting the nanostructure barrier 110 in detail. The nanostructure barrier 110 contacts the copper core wire 100. The nanostructure barrier 110 may have an average thickness 112 that is, for example, 1 percent to 10 percent of the average radius 102 of the copper core wire 100.

The nanostructure barrier 110 includes metal grains 114 and an inter-grain metal 116 between the metal grains 114. The metal grains 114 and the inter-grain metal 116 include the metals present in the barrier plating bath 104. An average combined concentration of nickel, cobalt, lanthanum, and cerium in the metal grains 114 is at least 65 weight percent. For the purposes of this disclosure, the term "average combined concentration" refers to a sum of the average concentrations of the relevant components. The nanostructure barrier 110 includes at least 1 weight percent and less than 35 weight percent total concentration of tungsten, and molybdenum. An average combined concentration of tungsten and molybdenum in the inter-grain metal 116 is higher than an average combined concentration of tungsten and molybdenum in the metal grains 114. Different compositions of the nanostructure barrier 110 may be selected to provide desired balances between barrier properties and fabrication cost. For example, the nanostructure barrier 110 may include primarily nickel and tungsten, with very little cobalt, cerium, lanthanum, and molybdenum.

The nanostructure barrier 110 may be formed using a reversed pulse plating process, sometimes referred to as a reverse pulse plating process. During a reversed pulse plating process applied to the barrier plating bath 104, forward current is flowed from the anode 108 in one or more forward pulses through the barrier plating bath 104 to the copper core wire 100, plating the metals from the barrier plating bath 104 onto the copper core wire 100 to form a portion of the nanostructure barrier 110. An amplitude and a duration of the forward pulses are selected to provide a size range of the metal grains 114 in the partially-formed nanostructure barrier 110. After the forward pulses, reverse current is flowed in one or more reverse pulses from the copper core wire 100 through the barrier plating bath 104 to the anode 108, selectively removing the tungsten and molybdenum from the surface of the partially-formed nanostructure barrier 110. An amplitude and a duration of the reverse pulses are selected to remove a desired amount of the tungsten and molybdenum. Tungsten and molybdenum diffuse from interiors of the metal grains 114 and accumulate to form the inter-grain metal 116 between grain boundaries of the metal grains 114. Thus, the reversed pulse plating process forms the nanostructure barrier 110 with the desired composition and structure. The forward pulses and reverse pulses may be repeated to form the nanostructure barrier 110 with the average thickness 112.

In an alternative to the instant example, the coated bond wire 106 of FIG. 1C may be formed by sputtering nickel and tungsten, in the appropriate amounts, onto the copper core wire 100 of FIG. 1C. Similarly, the coated bond wire 106 may be formed by sputtering a combination of nickel, cobalt, cerium, or lanthanum, together with tungsten or molybdenum, in the appropriate amounts, onto the copper core wire 100, to attain the nanostructure barrier 110 of FIG. 1D. Sputtering the nickel, cobalt, cerium, lanthanum, tungsten, and molybdenum may be implemented using separate sputter targets of nickel, cobalt, cerium, lanthanum, tungsten, and molybdenum, or using sputter targets having a combination of two or more of the nickel, cobalt, cerium, lanthanum, tungsten, and molybdenum. The nickel, cobalt, cerium, lanthanum, tungsten, and molybdenum may be sputtered sequentially or concurrently, or a combination of sequentially and concurrently.

In a further alternative to the instant example, the coated bond wire 106 may be formed by depositing nickel, cobalt, cerium, lanthanum, tungsten, or molybdenum onto the copper core wire 100 by a metalorganic chemical vapor deposition (MOCVD) process. Nickel precursors for MOCVD include allyl(cyclopentadienyl)nickel(II), bis(cyclopentadienyl)nickel(II), bis(ethylcyclo pentadienyl)nickel(II), bis (triphenylphosphine)nickel(II) dichloride, and nickel(II) bis (2,2,6,6-tetramethyl-3,5-heptanedionate). Cobalt precursors for MOCVD include bis(cyclopentadienyl)cobalt(II), bis (ethylcyclopentadienyl)cobalt(II), and bis(penta methylcyclopentadienyl)cobalt(II). Cerium precursors for MOCVD include cerium(III) trifluoroacetylacetonate hydrate, tetrakis (2,2, 6,6-tetramethyl-3,5 -heptanedionato) cerium(IV), tri s(cyclopentadienyl)cerium(III), tris(i-propylcyclopentadienyl)cerium(III), and tris(1,2,3,4-tetramethyl-2,4-cyclopentadienyl)cerium(III). Lanthanum precursors for MOCVD include lanthanum(III) i-propoxide, tris(cyclopentadienyl) lanthanum, tris(N,N'-di-i-propylformamidinato)lanthanum, and tris(i-propylcyclopentadienyl) lanthanum(III). Tungsten precursors for MOCVD include bis(t-butylimido) bis(dimethylamino)tungsten(VI), mesitylene tungsten tricarbonyl, tungsten carbonyl, and tungsten(VI) oxychloride. Molybdenum precursors for MOCVD include bis(t-butylimido)bis (dimethylamino)molybdenum(VI), bis(ethylbenzene)molybdenum, cyclo heptatriene molybdenum tricarbonyl, and molybdenum carbonyl.

Figure 2:
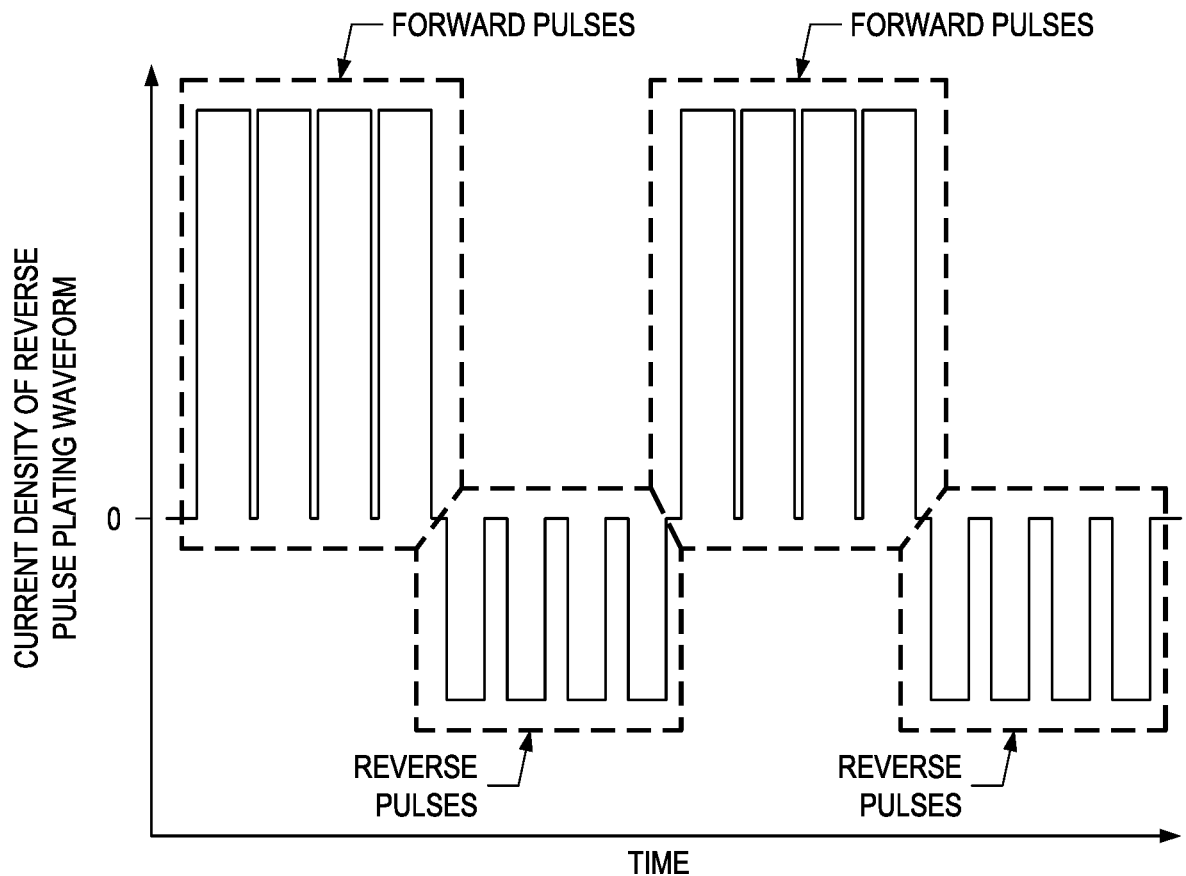
FIG. 2 depicts an example reverse pulse plating waveform.

FIG. 2 depicts an example reverse pulse plating waveform. The waveform depicts current density on the vertical axis as a function of time on the horizontal axis. In this example waveform, four forward pulses are applied, followed by four reverse pulses. A forward current density of the forward pulses may have a greater amplitude than a reverse current density of the reverse pulses, to provide a higher forward voltage between the barrier plating bath 104 and the copper core wire 100 of FIG. 1A, to plate the metals in the barrier plating bath 104 in a desired composition. The lower amplitude of the reverse current density of the reverse pulses may provide sufficient voltage between the barrier plating bath 104 and the copper core wire 100 to remove the tungsten and molybdenum in higher oxidation states, for example, $W^{+6}$ and $Mo^{+6}$, leaving a greater proportion of the nickel, cobalt, lanthanum, and cerium, having lower oxidation states, in the partially-formed nanostructure barrier 110 of FIG. 1D. The forward current density may range from about 0.5 amps per square centimeter ($A/cm^2$) to about 1.0 $A/cm^2$, and the duration of each forward pulse may range from 10 milliseconds to 50 milliseconds, with a duty cycle of 75 percent to 100 percent, to provide a desired metal grain structure in the nanostructure barrier 110. The reverse current density may be 35 percent to 60 percent of the forward current density, and the duration of the reverse pulses may range from 30 percent to 70 percent of the forward pulse duration, with a duty cycle of 60 percent to 100 percent, to provide a desired amount of tungsten and molybdenum in the nanostructure barrier 110. The combination of the forward pulses followed by the reverse pulses may be repeated to form the nanostructure barrier 110 with the average thickness 112 of FIG. 1D.

Figure 3A:
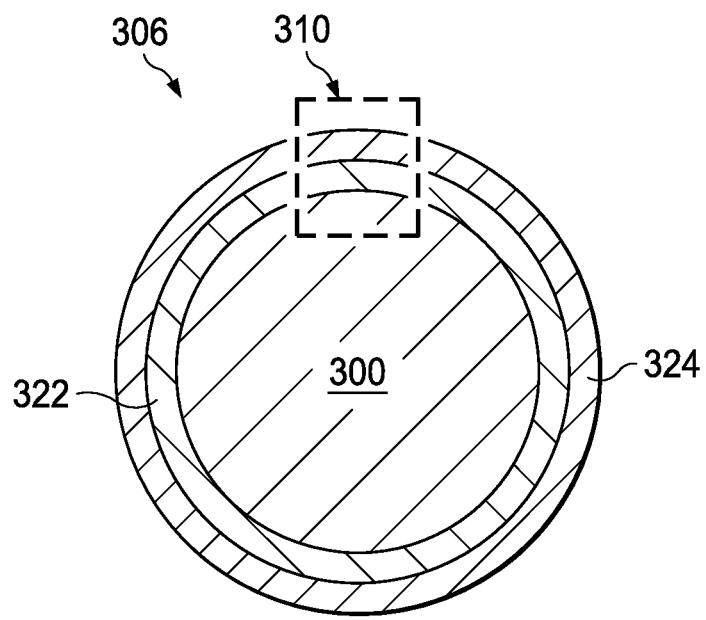
FIG. 3A and FIG. 3B depict another example coated bond wire.
Figure 3B:
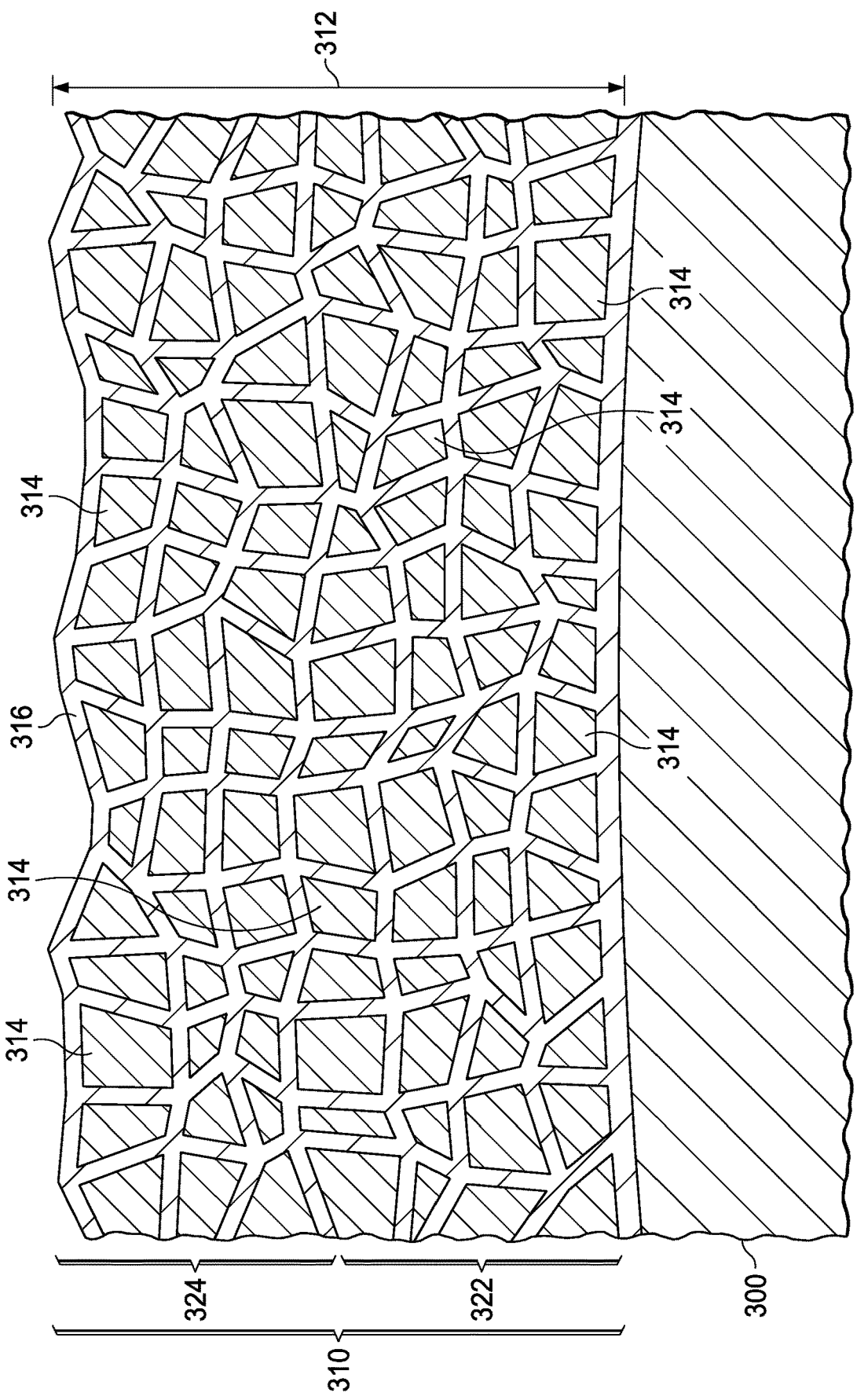

FIG. 3A and FIG. 3B depict another example coated bond wire. Referring to FIG. 3A, the coated bond wire 306 includes a copper core wire 300. The copper core wire 300 may have an average radius 302 and a composition similar to those disclosed in reference to the copper core wire 100 of FIG. 1A through FIG. 1D. The coated bond wire 306 includes a nanostructure barrier 310 surrounding the copper core wire 100.

In the instant example, the nanostructure barrier 310 includes a first barrier sublayer 322 of the nanostructure barrier 310 on the copper core wire 300, and a second barrier sublayer 324 of the nanostructure barrier 310 on the first barrier sublayer 322.

FIG. 3B is a cross section of a portion of the coated bond wire 306, depicting the nanostructure barrier 310 in detail. The nanostructure barrier 310 contacts the copper core wire 300. The nanostructure barrier 310 may have an average thickness 312 that is, for example, 1 percent to 10 percent of the average radius 302 of the copper core wire 300. The nanostructure barrier 310 includes metal grains 314 and an inter-grain metal 316 between the metal grains 314. The metal grains 314 and the inter-grain metal 316 both include a first metal selected from nickel or cobalt, and a second metal selected from tungsten or molybdenum. The metal grains 314 and the inter-grain metal 316 may include nickel and a third metal selected from cerium or lanthanum. An average combined concentration of tungsten and molybdenum in the inter-grain metal 316 is higher than an average combined concentration of tungsten and molybdenum in the metal grains 314. Concentrations of the nickel, cobalt, cerium, lanthanum, tungsten, and molybdenum are in the ranges disclosed in reference to FIG. 1D.

Both the first barrier sublayer 322 and the second barrier sublayer 324 include the metal grains 314 and the inter-grain metal 316. In one version of the instant example, the second barrier sublayer 324 may have a lower average combined concentration of tungsten and molybdenum than the first barrier sublayer 322. Having a higher average combined concentration of tungsten and molybdenum in the first barrier sublayer 322 may advantageously provide better protection for the copper core wire 300, while having a lower average combined concentration of tungsten and molybdenum in the second barrier sublayer 324 may provide more ductility which may advantageously improve reliability in a subsequently-formed wire bond using the coated bond wire 306.

The first barrier sublayer 322 and the second barrier sublayer 324 may be formed by electroplating using a single plating bath and a combination of two reverse pulse plating waveforms. The two reverse pulse plating waveforms may have different reverse pulse magnitudes, to vary the average combined concentration of tungsten and molybdenum between the first barrier sublayer 322 and the second barrier sublayer 324. A rate of movement of the copper core wire 300 through the plating bath may be coordinated with application of the two reverse pulse plating waveforms to attain the desired average combined concentrations of tungsten and molybdenum in the first barrier sublayer 322 and the second barrier sublayer 324. Alternatively, two separate plating baths may be used to form the first barrier sublayer 322 and the second barrier sublayer 324.

In further versions of the instant example, the nanostructure barrier 310 may include three or more barrier sublayers. The barrier sublayers may have a decreasing average combined concentration of tungsten and molybdenum from directly adjacent to the copper core wire 300 to an exterior surface of the coated bond wire 306. In an alternative to the instant example, the nanostructure barrier 310 may be formed by a sputter operation, or by an MOCVD operations, as disclosed herein.

Figure 4A:
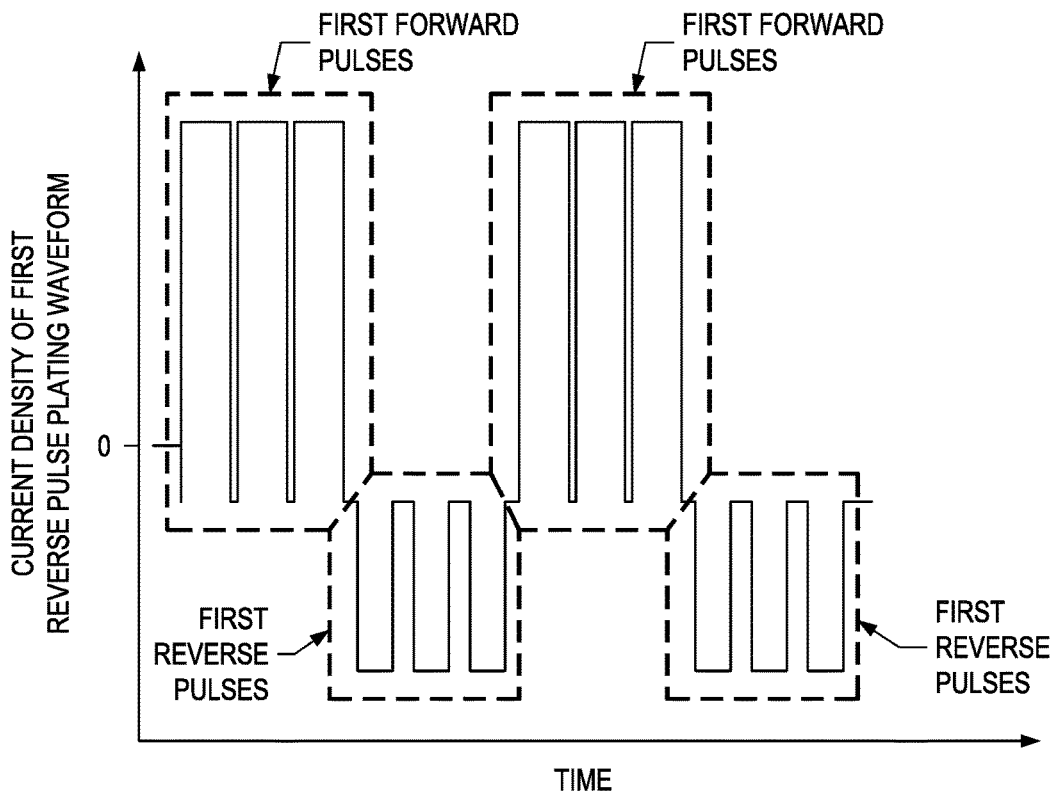
FIG. 4A and FIG. 4B depict an example set of reverse pulse plating waveforms which may be used to form the nanostructure barrier disclosed in reference to FIG. 3A and FIG. 3B.
Figure 4B:
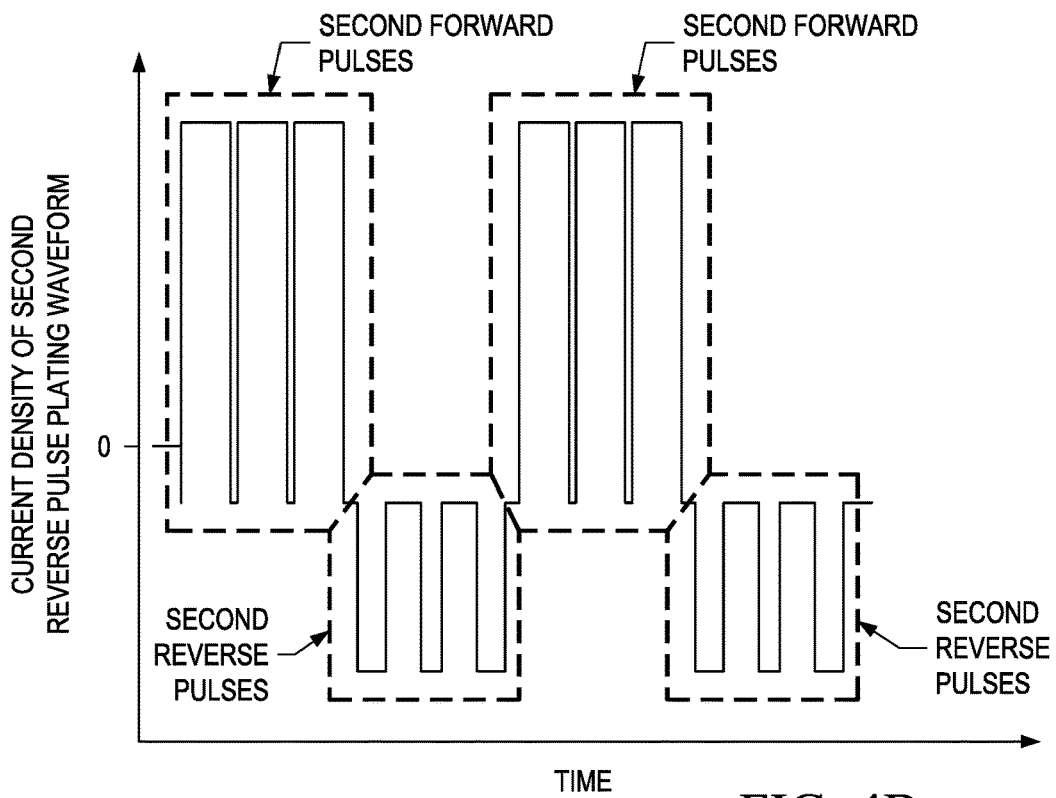

FIG. 4A and FIG. 4B depict an example set of reverse pulse plating waveforms which may be used to form the nanostructure barrier 310 disclosed in reference to FIG. 3A and FIG. 3B. Each waveform depicts current density on the vertical axis as a function of time on the horizontal axis.

Referring to FIG. 4A, the first reverse pulse plating waveform has a cycle of three first forward pulses followed by three first reverse pulses. A forward current density of the first forward pulses may have a greater amplitude than a reverse current density of the first reverse pulses, as explained in reference to FIG. 2, to plate the metals so as to provide a desired composition for the first barrier sublayer 322 of FIG. 3B. The first forward pulses may have a first forward current density and first durations as disclosed in reference to FIG. 2. The first reverse pulses may have a similar relationship to the first forward pulses as that disclosed in reference to FIG. 2. The combination of the first forward pulses followed by the first reverse pulses may be repeated to form the first barrier sublayer 322.

Referring to FIG. 4B, the second reverse pulse plating waveform has a pattern of second forward pulses followed by second reverse pulses, similar to the first reverse pulse plating waveform. The second reverse pulses may have longer durations than the first reverse pulses, to remove more tungsten and molybdenum, to form the second barrier sublayer 324 with less tungsten and molybdenum than the first barrier sublayer 322.

Figure 5A:
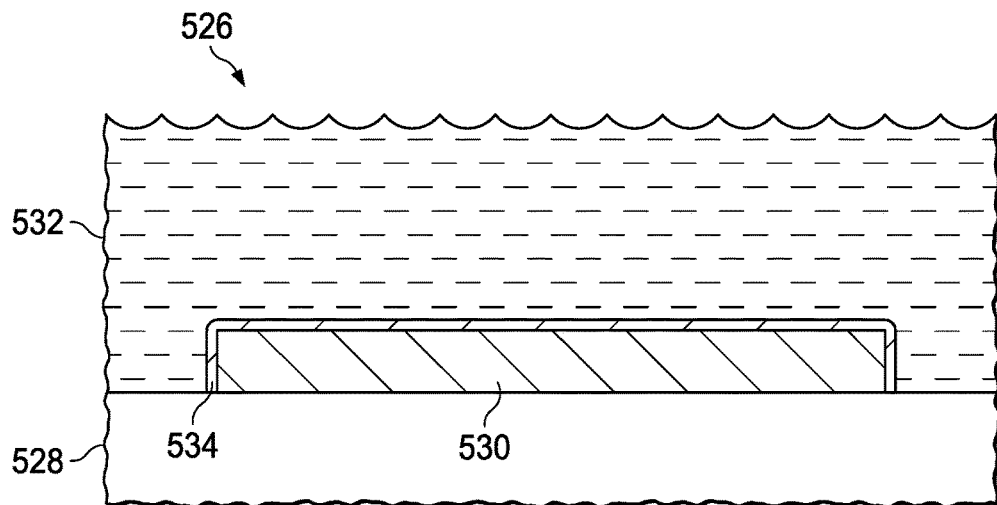
FIG. 5A through FIG. 5G depict an example method of forming a microelectronic device.

FIG. 5A through FIG. 5G depict an example method of forming a microelectronic device. Referring to FIG. 5A, the microelectronic device 526 includes a substrate 528 and a bond pad 530 on the substrate 528. The substrate 528 may include, for example, an integrated circuit, a discrete semiconductor device, or a dielectric layer which supports a plurality of separate semiconductor devices. The bond pad 530 includes primarily aluminum, and may be 1 micron to 5 microns thick. For example, the bond pad 530 may include at least 90 weight percent aluminum, with a few weight percent silicon, copper, or titanium to reduce electromigration.

The bond pad 530 is exposed to a zincating solution 532 which forms a zinc-containing layer 534 on the bond pad 530. The zincating solution 532 is an aqueous solution which includes zinc in the form of tetrahydroxozincate $(Zn(OH)_4^{2-})$. The zinc in the zincating solution 532 displaces aluminum from the bond pad 530 to form the zinc-containing layer 534. A pretreatment of the bond pad 530 to remove native aluminum oxide from a surface of the bond pad 530 may precede exposing the bond pad 530 to the zincating solution 532. An example formulation for the zincating solution 532 may include zinc oxide (ZnO), sodium hydroxide (NaOH), ferric chloride ($FeCl_3$), and potassium sodium tartrate tetrahydrate, also known as Rochelle salt. The bond pad 530 may be exposed to the zincating solution 532 twice, with a surface cleaning process between exposures, referred to as a double zincating process, to form a desired composition and uniformity in the zinc-containing layer 534. The zinc-containing layer 534 may have a thickness of 0.5 microns to 5 microns, for example.

Figure 5B:
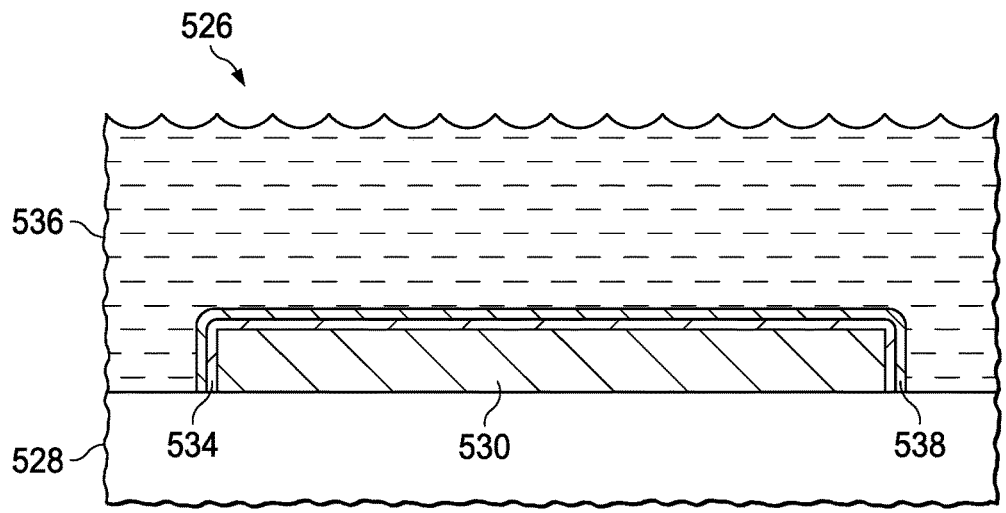

Referring to FIG. 5B, the zinc-containing layer 534 is exposed to an electroless nickel plating solution 536 which forms a nickel-containing layer 538 on the zinc-containing layer 534. Commonly used formulations for the electroless nickel plating solution 536 are generally proprietary, and are available commercially from a number of suppliers. The nickel-containing layer 538 may have a thickness of 0.5 microns to 5 microns, for example.

Figure 5C:
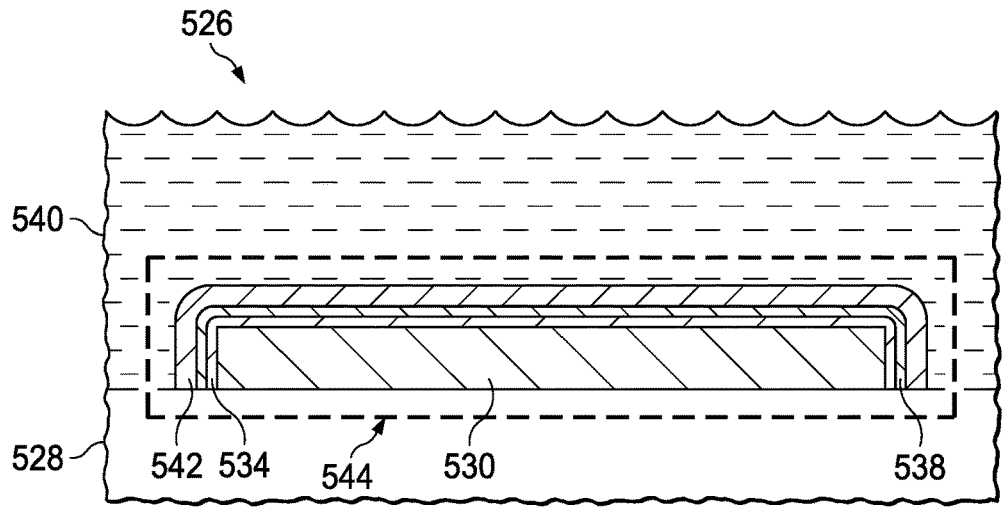

Referring to FIG. 5C, the nickel-containing layer 538 is exposed to a barrier plating bath 540. The barrier plating bath 540 may have a formulation as disclosed in reference to the barrier plating bath 104 of FIG. 1. A first nanostructure barrier 542 is formed on the nickel-containing layer 538 using the barrier plating bath 540. The first nanostructure barrier 542 may be formed using a reverse pulse plating process, as disclosed in reference to FIG. 2. The first nanostructure barrier 542 may have the structure disclosed in reference to the nanostructure barrier 110 of FIG. 1D. The first nanostructure barrier 542 may have a thickness of 0.5 microns to 3 microns, for example. The first nanostructure barrier 542 on the bond pad 530 provides a coated bond pad 544.

Figure 5D:
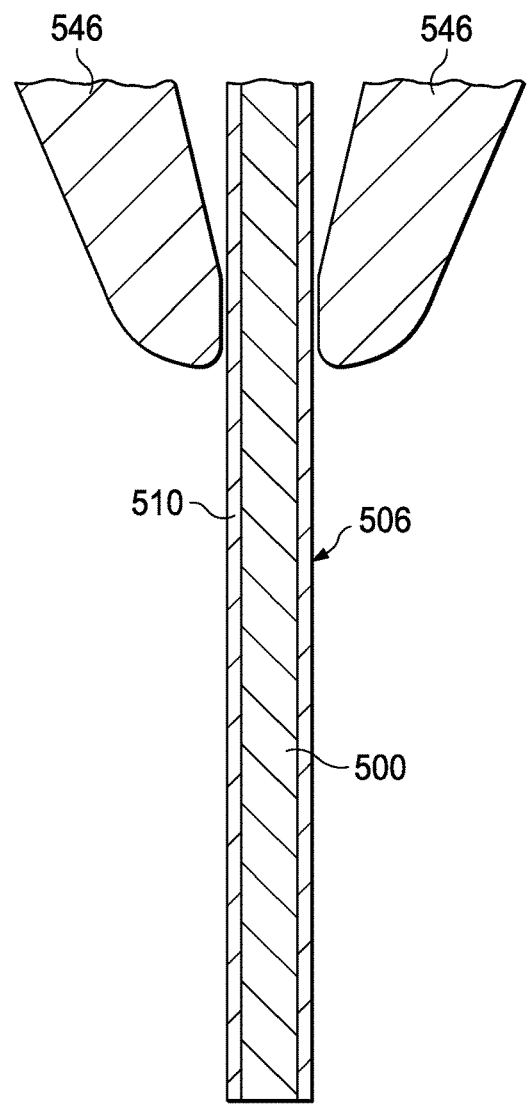
Figure 5D:
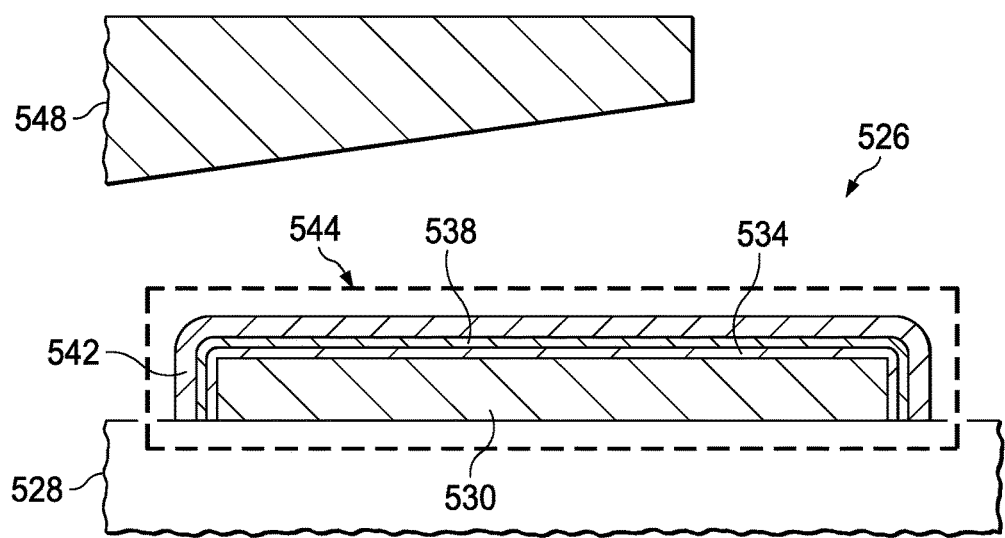

Referring to FIG. 5D, a coated bond wire 506 is extended through a wire bond capillary 546. The coated bond wire 506 includes a copper core wire 500 and a second nanostructure barrier 510 on the copper core wire 500. The coated bond wire 506 may have a structure and a composition similar to those disclosed in reference to FIG. 1A through FIG. 1D, or in reference to FIG. 3A and FIG. 3B.

An electronic flame off (EFO) wand 548 is positioned proximate to an end of the coated bond wire 506 protruding from the wire bond capillary 546. The EFO wand 548 is electrically connected to a circuit, not shown, which provides a high voltage spark to the coated bond wire 506.

Figure 5E:
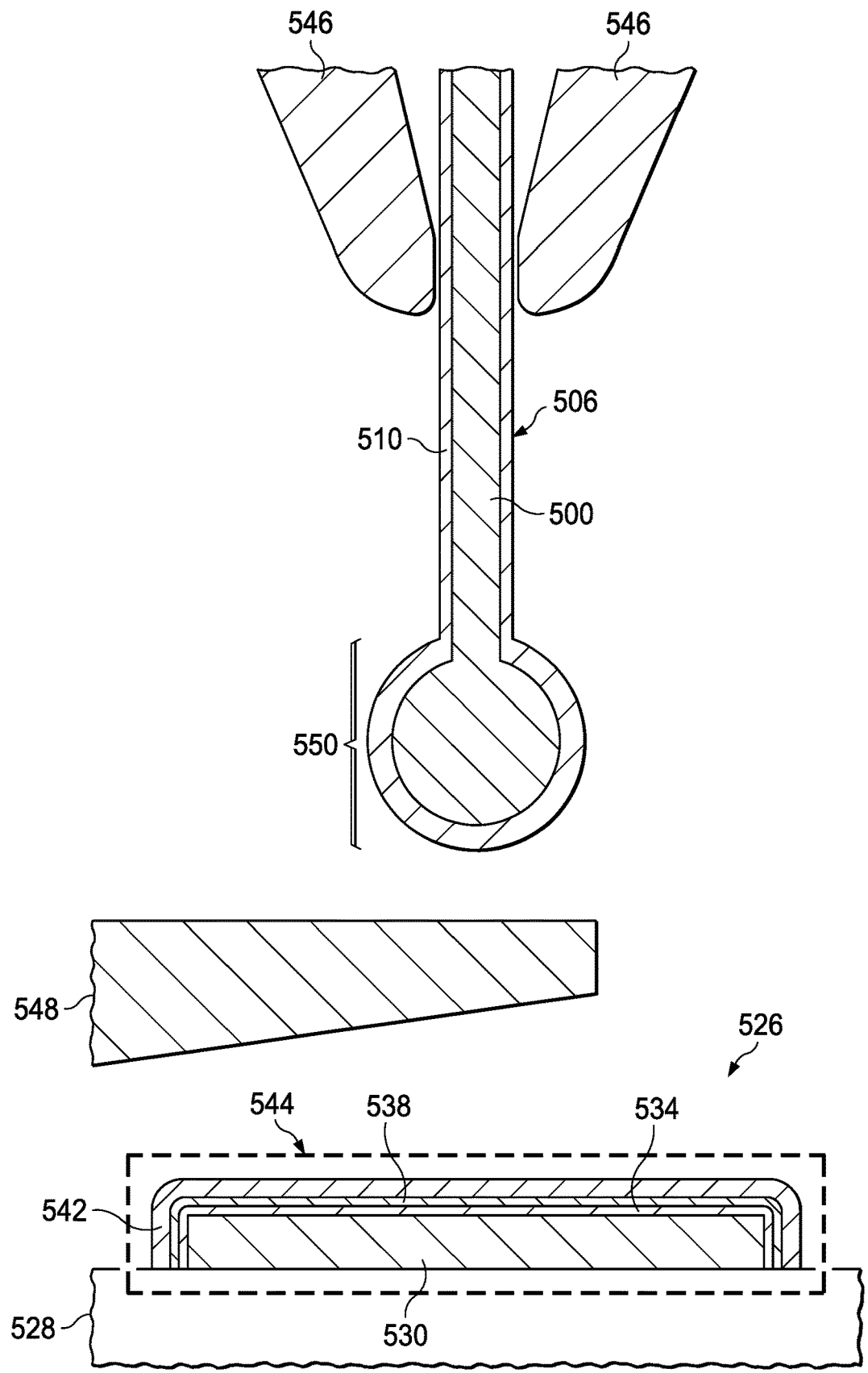

Referring to FIG. 5E, a spark from the EFO wand 548 to the coated bond wire 506 melts a portion of the coated bond wire 506 and forms a wire bond ball 550 from the melted portion at the end of the coated bond wire 506. The wire bond ball 550 is sometimes referred to as a free air ball (FAB). The wire bond ball 550 includes copper from the copper core wire 500. The second nanostructure barrier 510 may extend around a surface of the wire bond ball 550, as depicted in FIG. 5E. The second nanostructure barrier 510 need not extend completely around, or completely surround, the surface of the wire bond ball 550 in all cases.

Figure 5F:
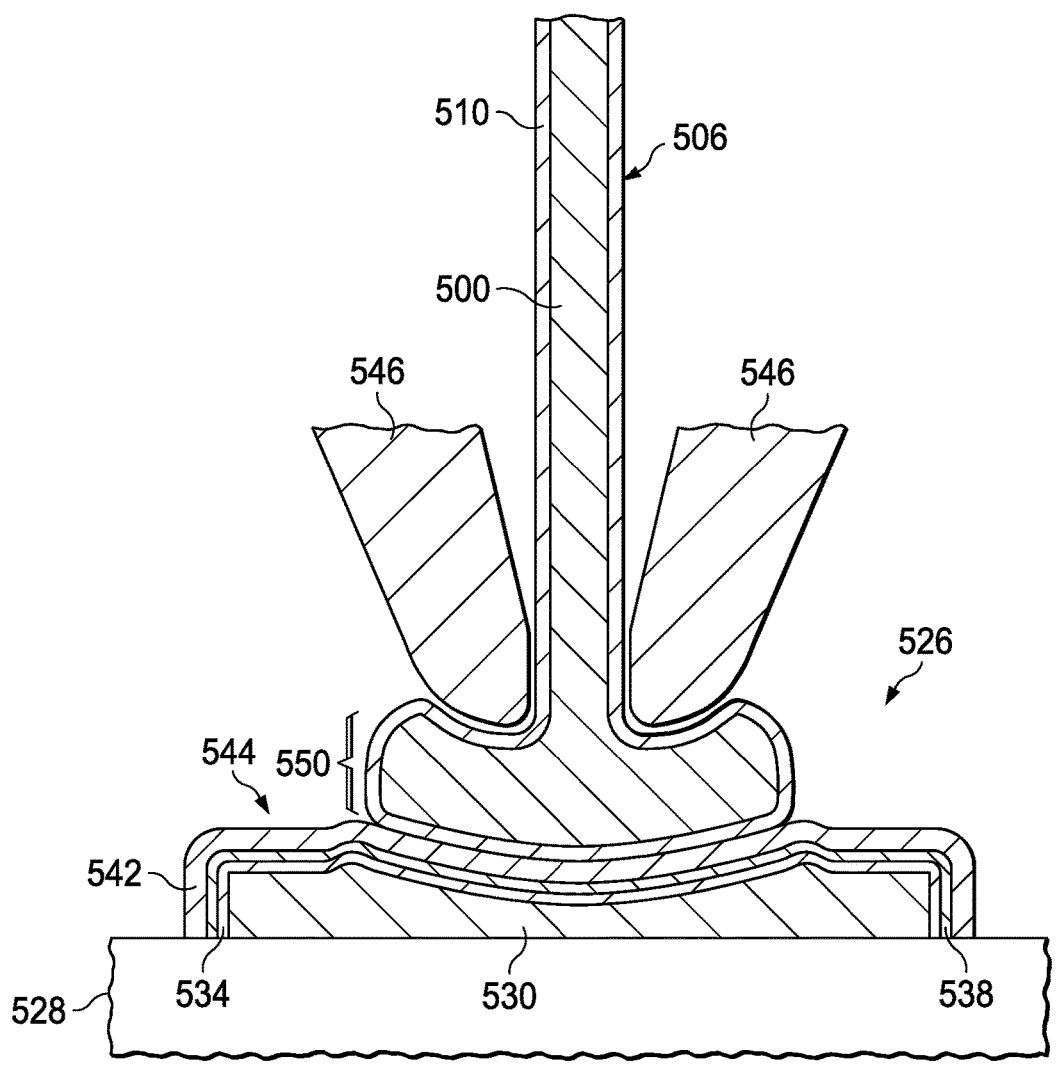

Referring to FIG. 5F, a wire bond operation is performed which includes pressing the wire bond ball 550 onto the coated bond pad 544 by the wire bond capillary 546, resulting in the wire bond ball 550 being bonded to the coated bond pad 544. The wire bond capillary 546 may be heated, and may be vibrated at an ultrasonic frequency, to assist bonding the wire bond ball 550 to the coated bond pad 544. The first nanostructure barrier 542, or the second nanostructure barrier 510 on the wire bond ball 550, may isolate the copper in the wire bond ball 550 from the aluminum in the bond pad 530, advantageously reducing formation of a copper aluminum intermetallic compound (IMC). A copper aluminum IMC between the wire bond ball 550 and the bond pad 530 may increase an electrical resistance between the wire bond ball 550 and the bond pad 530 and may result in failure of the microelectronic device 526.

In an alternative version of the instant example, the second nanostructure barrier 510 on the copper core wire 500 may be omitted, so that the wire bond ball 550 has copper exposed at the surface of the wire bond ball 550. In such a case, the first nanostructure barrier 542 on the bond pad 530 may isolate the copper in the wire bond ball 550 from the aluminum in the bond pad 530. In another alternative version of the instant example, the zinc-containing layer 534, the nickel-containing layer 538, and the first nanostructure barrier 542 on the bond pad 530 may be omitted, so that the bond pad 530 has aluminum exposed at the surface of the bond pad 530. In such a case, the second nanostructure barrier 510 on the wire bond ball 550 may isolate the copper in the wire bond ball 550 from the aluminum in the bond pad 530.

Figure 5G:
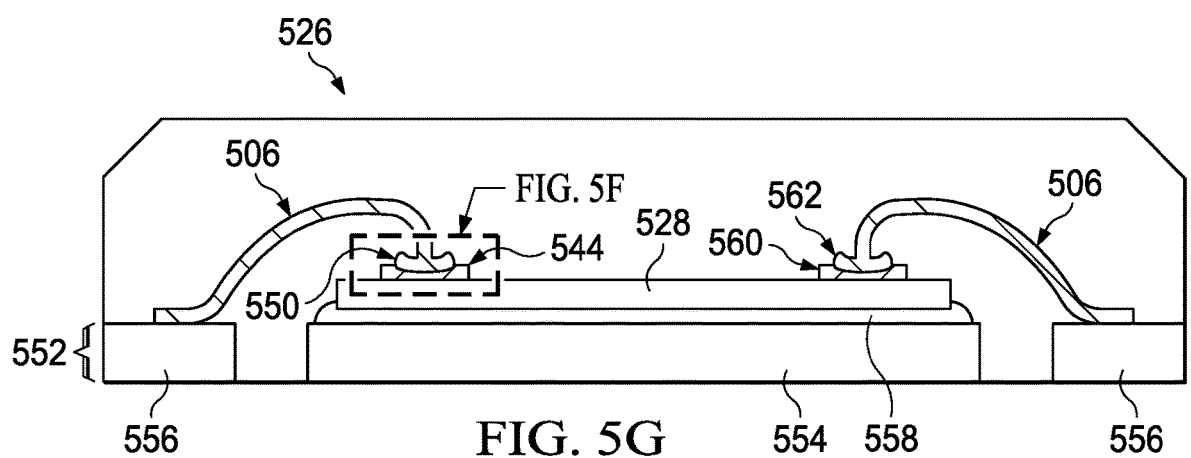

FIG. 5G is a cross section of the microelectronic device (526). The substrate (528) may be attached to a lead frame (552). The lead frame (552) may include a die mount element (554) and leads (556). The substrate (528) may be attached to the die mount element (554) by a die attach material (558) such as solder or adhesive. The coated bond wire (506) extends from the wire bond ball 550 to one of the leads (556).

The microelectronic device (526) may include additional coated bond pads (560). Additional segments of the coated bond wire (506) may be used to form additional wire bond balls (562) which are subsequently wire bonded to the additional coated bond pads (560).

The microelectronic device (526) and lead frame (552) may be encapsulated by an encapsulation material (564), such as epoxy. The encapsulation material (564) may surround the coated bond wire (506) and the substrate (528), and may leave the leads (556) exposed for external connections.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A method of forming a coated bond wire, comprising:
   providing a copper core wire, the copper core wire
     including more than 90 weight percent copper; and plating at least a first metal and at least a second metal on the copper core wire to form a barrier on the copper core wire, wherein:
the first metal is selected from the group consisting of nickel and cobalt;
the second metal is selected from the group consisting of tungsten and molybdenum;
the barrier includes metal and an inter metal between the metal;
the metal includes the first metal and the second metal;
the inter metal includes the first metal and the second metal; and
a concentration of the second metal is higher in the inter metal than in the metal.

2. The method of claim 1, wherein an average combined concentration of tungsten and molybdenum in the barrier is 1 weight percent to 35 weight percent.

3. The method of claim 1, wherein the barrier includes nickel and a third metal selected from the group consisting of cerium and lanthanum.

4. The method of claim 1, wherein the barrier is a nanostructure.

5. The method of claim 1, wherein the metal is in the form of a metal grain.

6. The method of claim 1, wherein the inter metal is in the form of an inter-metal grain.

7. A method of forming a microelectronic device, comprising:
providing a substrate having a bond pad on the substrate;
providing a coated bond wire, the coated bond wire including:
a copper core wire, the copper core wire including more than 90 weight percent copper; and
a barrier on a surface of the copper core wire, wherein:
the barrier includes a first metal selected from the group consisting of nickel and cobalt;
the barrier includes a second metal selected from the group consisting of tungsten and molybdenum;
the barrier includes metal grains which include the first metal and the second metal, and an inter-grain metal which includes the first metal and the second metal, between the metal grains; and
a concentration of the second metal is higher in the inter-grain metal than in the metal grains;
forming a wire bond ball at an end of the coated bond wire, wherein the wire bond ball includes copper from the copper core wire, and the barrier extends around a surface of the wire bond ball; and
pressing the wire bond ball onto the bond pad, so that the wire bond ball is bonded to the bond pad.

8. The method of claim 7, wherein an average combined concentration of tungsten and molybdenum in the barrier is 1 weight percent to 35 weight percent.

9. The method of claim 7, wherein the barrier includes nickel and a third metal selected from the group consisting of cerium and lanthanum.

10. The method of claim 7, wherein the bond pad includes aluminum, and the barrier isolates the copper in the wire bond ball from the aluminum in the bond pad.

11. The method of claim 7, wherein the barrier is a nanostructure.

12. A method of forming a microelectronic device, comprising:
providing a substrate having a bond pad on the substrate, wherein the bond pad includes at least 90 weight percent aluminum;
forming a zinc-containing layer on the bond pad;
forming a nickel-containing layer on the zinc-containing layer; and
forming a barrier on the nickel-containing layer, wherein:
the barrier includes a first metal selected from the group consisting of nickel and cobalt;
the barrier includes a second metal selected from the group consisting of tungsten and molybdenum;
the barrier includes metal grains which include the first metal and the second metal, and an inter-grain metal which includes the first metal and the second metal, between the metal grains; and
a concentration of the second metal is higher in the inter-grain metal than in the metal grains.

13. The method of claim 12, wherein an average combined concentration of tungsten and molybdenum in the barrier is 1 weight percent to 35 weight percent.

14. The method of claim 12, wherein the barrier includes nickel and a third metal selected from the group consisting of cerium and lanthanum.

15. The method of claim 12, wherein the barrier is a nanostructure.

* * * * *